(12) United States Patent
Haberger (10) Patent No.: US 10,136,508 B2
(45) Date of Patent: Nov. 20, 2018

(54) CYCLIC ACCELERATOR FOR ACCELERATING CHARGE CARRIERS AND METHOD FOR MANUFACTURING A CYCLIC ACCELERATOR

(71) Applicant: Fraunhofer-Gesellschaft zur Foerderung der angewandten Forschung e.V., Munich (DE)

(72) Inventor: Karl Haberger, Martinsried (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 368 days.

(21) Appl. No.: 15/000,777

(22) Filed: Jan. 19, 2016

(65) Prior Publication Data

US 2016/0212834 A1    Jul. 21, 2016

(30) Foreign Application Priority Data

Jan. 19, 2015   (DE) .................. 10 2015 200 739

(51) Int. Cl.
| | |
|---|---|
| *B81B 7/02* | (2006.01) |
| *H05G 2/00* | (2006.01) |
| *H05H 7/04* | (2006.01) |
| *H05H 7/14* | (2006.01) |
| *H05H 7/18* | (2006.01) |

(Continued)

(52) U.S. Cl.
CPC ................ *H05G 2/00* (2013.01); *B81B 7/02* (2013.01); *H05H 7/04* (2013.01); *H05H 7/14* (2013.01); *H05H 7/18* (2013.01); *H05H 13/00* (2013.01); *H05H 13/005* (2013.01); *H05H 15/00* (2013.01)

(58) Field of Classification Search
CPC ...... H05H 13/005; H05H 13/00; H05H 15/00; H05H 7/04; H05H 7/14; H05H 7/18; B81B 7/02; H05G 2/00; H01J 35/02; H01J 35/065; H01J 35/16
See application file for complete search history.

(56) References Cited

U.S. PATENT DOCUMENTS

| | | | | |
|---|---|---|---|---|
| 4,165,525 | A | * 8/1979 | Koel | ....................... G11B 5/313 360/123.13 |
| 4,859,855 | A | * 8/1989 | Vlasbloem | .............. H01J 47/02 378/145 |
| 4,990,827 | A | 2/1991 | Ehrfeld et al. | |

(Continued)

FOREIGN PATENT DOCUMENTS

| | | |
|---|---|---|
| DE | 3709298 A1 | 9/1988 |
| DE | 102013209266 A1 | 11/2014 |

*Primary Examiner* — Chih-Cheng Kao
(74) *Attorney, Agent, or Firm* — Perkins Coie LLP; Michael A. Glenn (57) ABSTRACT

What is shown is a cyclic accelerator for accelerating charge carriers. The cyclic accelerator includes a charge carrier source configured to generate free charge carriers, a vacuum chamber configured to receive the free charge carriers, wherein the vacuum chamber is produced by means of MEMS technology, and wherein at least a main surface region of the vacuum chamber has a semiconductor material. In addition, the cyclic accelerator has electrodes configured to accelerate the free charge carriers in the vacuum chamber by means of an alternating current field, and a magnetic field generator configured to generate a magnetic field perpendicularly to the direction of movement of the charge carriers.

23 Claims, 5 Drawing Sheets

(51) Int. Cl.
*H05H 13/00* (2006.01)
*H05H 15/00* (2006.01)

(56) References Cited

U.S. PATENT DOCUMENTS

| | | | |
|---|---|---|---|
| 5,399,873 A | | 3/1995 | Takafuji et al. |
| 5,504,791 A | * | 4/1996 | Hell ............... A61B 6/032 |
| | | | 378/10 |
| 7,706,506 B1 | * | 4/2010 | Woodruff ............ G21K 1/10 |
| | | | 378/121 |
| 2001/0034133 A1 | * | 10/2001 | Gobel ............ H01L 27/10864 |
| | | | 438/700 |
| 2003/0021377 A1 | * | 1/2003 | Turner ............. G01N 23/223 |
| | | | 378/102 |
| 2005/0123095 A1 | * | 6/2005 | Marshall ............ H01J 35/025 |
| | | | 378/122 |
| 2005/0287012 A1 | | 12/2005 | Govyandinov et al. |
| 2012/0037814 A1 | | 2/2012 | Lal et al. |

* cited by examiner

CYCLIC ACCELERATOR FOR ACCELERATING CHARGE CARRIERS AND METHOD FOR MANUFACTURING A CYCLIC ACCELERATOR

CROSS-REFERENCE TO RELATED APPLICATION

This application claims priority from German Application No. 10 2015 200 739.1, which was filed on Jan. 19, 2015 and is incorporated herein by reference in its entirety.

BACKGROUND OF THE INVENTION

The present invention relates to a cyclic accelerator for accelerating charge carriers and to a method for manufacturing the cyclic accelerator. Embodiments show an MEMS cyclotron functioning as a radiation source.

Various apparatuses necessitate high-energy radiation, either for analysis or ionization purposes. The simplest sources here are radioactive substances. Of disadvantage here is that they cannot be switched off, what makes practical and administrative handling thereof dramatically more difficult.

An electrical source of radiation which may be realized using the known methods of MEMS technology is outlined here. The easiest case of an x-ray source is an electron emitter combined with an acceleration distance; for example a Spindt emitter in combination with a high-voltage distance in a vacuum. Unfortunately, this simple concept is difficult to miniaturize for high energies due to possible flashovers and due to the high voltages applied to the apparatus in operation.

Acceleration distances which are passed cyclically can work with very much lower electrical potential differences and consequently can be miniaturized better. The best known approach for a long time is the cyclotron. A magnetic field applied vertically to the movement of electrons forces the electrons onto spiral trajectories; the electrons are accelerated by an alternating field of suitable frequency with each passing. This has been realized technically in large-scale units for nearly one hundred years.

SUMMARY

According to an embodiment, a cyclic accelerator for accelerating charge carriers may have: a charge carrier source configured to generate free charge carriers; a vacuum chamber configured to receive the free charge carriers, wherein the vacuum chamber is produced by means of MEMS technology; electrodes configured to accelerate the free charge carriers in the vacuum chamber by means of an alternating current field; a magnetic field generator configured to generate a magnetic field perpendicularly to the direction of movement of the charge carriers; wherein an anode which is configured to emit x-rays to the surroundings of the cyclic accelerator by a charge carrier impinging is arranged adjacent to the vacuum chamber.

According to another embodiment, a method for manufacturing a cyclic accelerator may have the steps of: providing a substrate which has a semiconductor material, for the cyclic accelerator; applying a mask onto the substrate; etching a vacuum chamber into a sub-region of the semiconductor material defined by the mask or a layer of another material arranged above the semiconductor material; producing electrodes at a main surface region of the vacuum chamber; introducing a charge carrier source into the vacuum chamber; sealing and evacuating the vacuum chamber in a vacuum-tight manner; arranging a magnetic field generator such that a magnetic field is generated in the thickness direction of the vacuum chamber; and arranging an anode adjacent to the vacuum chamber, wherein the anode is configured to emit x-rays to the surroundings of the cyclic accelerator by a charge carrier impinging.

Embodiments show a cyclic accelerator for accelerating charge carriers. The cyclic accelerator comprises a charge carrier source for generating free charge carriers and a vacuum chamber configured to receive the free charge carriers. The vacuum chamber is manufactured by means of MEMS technology. In addition, the cyclic accelerator includes electrodes configured to accelerate the free charge carriers in the vacuum chamber by means of an alternating current field, and a magnetic field generator generating a magnetic field perpendicularly to the direction of movement of the charge carriers.

The invention is based on the finding that a cyclic accelerator, such as, for example, a cyclotron, can be miniaturized when being manufactured in or on a semiconductor substrate by means of MEMS technology. In addition, smaller acceleration periods are necessitated due to the small structural design such that portable cyclic accelerators, for example comparable to the form of a bar code scanner, may be manufactured. This allows creating a portable x-ray device, in combination with an x-ray target and an x-ray detector.

Embodiments show that the electrodes are formed from highly doped regions of the semiconductor material. This is of advantage since electrodes may be generated by doping the semiconductor material and the usage of additional material, such as, for example, depositing a metal electrode, can be avoided.

In accordance with another embodiment, the vacuum chamber is generated by etching the semiconductor material in the semiconductor material. Alternatively, another layer of another material may be applied onto the semiconductor material, for example a protection or insulation layer, in which the vacuum chamber is etched such that at least the floor of the vacuum chamber comprises the semiconductor material. This is of advantage since this allows doping the semiconductor material, exemplarily for generating the electrodes. Furthermore, etching allows the vacuum chamber to be structured very precisely.

In accordance with an embodiment, the cyclic accelerator may be set up from a first subcomponent and a second subcomponent. The two subcomponents are connected to each other in an air-tight manner, for example by means of a gluing method, anodic bonding or silicon fusion bonding. In addition the electrodes may be arranged to be congruent at a main surface region of the first subcomponent and at a main surface region of the second subcomponent opposite the main surface region of the first subcomponent. This is of advantage since forces on charge carriers not acting within the rotational plane are avoided. Additionally, a rib or column connecting the two main surface regions may be arranged in the vacuum chamber, for example for stabilizing the first and the second subcomponent.

In accordance with further embodiments, the charge carrier source is a heating wire which may be covered with an alkaline earth oxide to improve the charge carrier yield. Other charge carriers may, for example, be a carbon nanotube or a Spindt emitter, wherein the Spindt emitter may also be manufactured by means of MEMS technology.

In addition, embodiments show that another chamber within which a getter substance is present which reacts with the gaseous molecule present in the vacuum chamber and thus evacuates the vacuum chamber is arranged adjacent to the vacuum chamber and connected to the vacuum chamber via a connection channel, i.e. a vacuum is generated in the vacuum chamber. This is of advantage since the vacuum may be generated in this way and also be maintained over a long period of time with a sufficient quantity of the getter substance. In order to increase the surface and area and, connected thereto, the bondability of the getter substance, same may exemplarily be evaporated locally using infrared laser radiation which penetrates the semiconductor material. Titanium and/or magnesium may, for example, be used as the getter substance.

In accordance with further embodiments, the magnetic field generator is a permanent magnet. This allows the cyclic accelerator to be operated with less energy consumption, for example compared to using electromagnets as magnetic field generators. The magnetic field generator may comprise at least two pole shoes, wherein the vacuum chamber is arranged between the at least two pole shoes. This arrangement is of advantage since a magnetic field is thus generated within the vacuum chamber in the thickness direction. Additionally, a piezo film which can adjust a distance between the at least two pole shoes such that a desired resonant frequency of the accelerated charge carriers is achieved may be arranged between the pole shoes. Additionally or alternatively, the cyclic accelerator may comprise an auxiliary coil through which a current flows which adjusts the magnetic field of the magnetic field generator such that a desired resonant frequency of the accelerated charge carriers is achieved.

In accordance with further embodiments the cyclic accelerator comprises a fixed-frequency oscillator or a Gunn diode applying an alternating voltage to the electrodes, wherein the frequency of the alternating voltage is adapted to the geometry of the vacuum chamber.

Additionally, the cyclic accelerator may be used for generating x-rays. An embodiment shows an anode arranged to be adjacent to the vacuum chamber which emits x-rays to the surroundings of the cyclic accelerator when a charge carrier impinges. Alternatively, the anode may also be arranged outside the cyclic accelerator such that the charge carriers at first leave/the cyclic accelerator and the x-rays are generated outside the cyclic accelerator after the charge carriers have impinged onto the anode.

The method for manufacturing the cyclic accelerator will be described in detail in the following description.

BRIEF DESCRIPTION OF THE DRAWINGS

Embodiments of the present invention will be detailed subsequently referring to the appended drawings, in which.

DETAILED DESCRIPTION OF THE INVENTION

Same elements or elements of equal effect are provided with same reference numerals in the following description of the figures such that the description thereof in the different embodiments is mutually exchangeable.

The goal of the invention is providing a miniaturized source of radiation for generating x-rays taking up only a few cm³. This source operates in accordance with the cyclotron principle, thus avoids high acceleration voltages and may advantageously be built into small apparatuses, for example for material analysis. Manufacturing basically is to take place using the methods of silicon MEMS technology.

As is well-known, the basic equations of a cyclotron combine the resonant frequency v and the magnetic field strength B to the speed of electrons v, in dependence on the resonant frequency:

$$v = \frac{1}{2\pi} \cdot \frac{e}{m} \cdot B$$

and result in a trajectory radius $$r = \frac{m \cdot v}{e \cdot B},$$

wherein $$\frac{e}{m}$$

is the specific charge of the particle to be accelerated, i.e. of the electron.

An estimation based thereon results in a resonant frequency in the region of typically 30 GHz, for radii of typically 0.2 cm and magnetic field strengths of 1.3 Tesla.

Meanwhile, the parameters or materials outlined herein and the processing steps are relatively cheap and may particularly be realized using the methods of MEMS technology: permanent magnets made of NdFeB (neodymium-iron-boron) with residual field strengths of 1.3 Tesla and beyond, in addition, are available at low cost and high-frequency oscillators which are cheap and miniaturized in the frequency range mentioned and also beyond, are widely used, for example used as distance radar in automobiles.

The vacuum ratio necessitated for acceleration is produced by means of MEMS technology and is to be described below using suitable embodiments as follows:

The figures refer to a manufacturing process which at present is considered to be of advantage. Correspondingly, the cyclotron or cyclic accelerator may be manufactured from two silicon parts which later on are to be connected over the entire area. Suitably, the vacuum functionality is realized in one section and the electrical functionality in another section. However, the device may also be realized using a different method, for example when the functionality is realized in a segment and the second segment functions exclusively as a cover plate, or when the cyclic accelerator is, for example, set up from more than two segments.

Figure 1A:
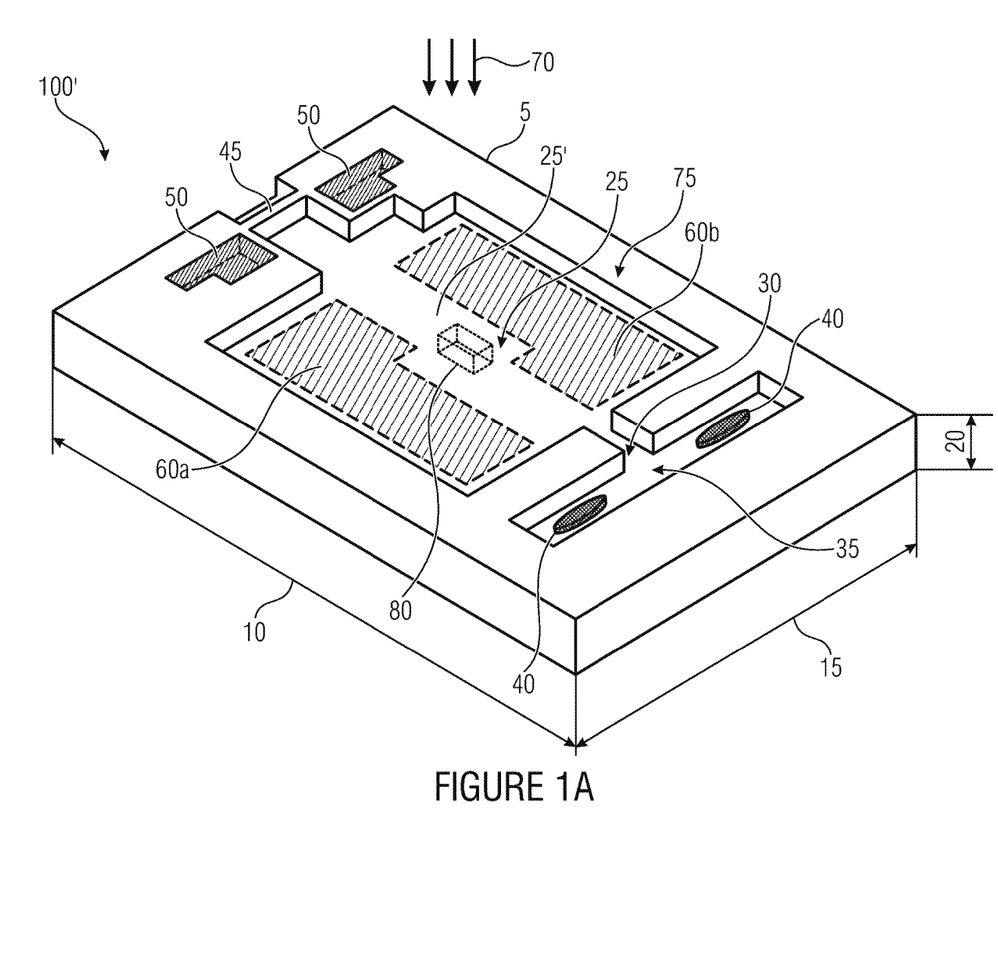
FIG. 1a is a schematic illustration of a bottom part of the cyclic accelerator.

FIG. 1a shows a piece of silicon 5 processed by means of the conventional MEMS technology, defining a bottom part 100' of a cyclic accelerator, in the typical dimensions 10, 15, 20 of 12×9×0.4 mm or 10×10×0.5 mm. In addition, semiconductor substrates of different dimensions may also be used. As far as the etching technology is concerned, a structure 25 not necessarily confined by rectangles is etched therein, which will later on form the vacuum container.

The etching depth is, for example, 0.2 mm (200 μm). The surface of this etched cavity 25 may be covered with an insulator, like $SiO_2$.

Further regions which for reasons of simplicity, but not necessarily are formed to be symmetrical follow after the large region 25 which forms the vacuum chamber. The large region 25 represents the evacuated cyclotron chamber. Chambers 35, connected via a channel 30, which are used for evacuation, which advantageously are partly covered by a getter substance 40 (for example titanium or magnesium) follow.

A region illustrated at the top of the picture serves as an exit window 45 for the accelerated electrons. It is of advantage to integrate the "anode" 50, i.e. the brems target generating the x-rays, into the silicon 5. Part of the deep-etched structures here may be filled with tungsten material. On the one hand, tungsten is a material tolerated and widely used in CMOS manufacturing which comprises an atomic number suitable, since high, for efficiently generating bremsstrahlung and, on the other hand, an efficient removal of heat to the surrounding silicon can be achieved due to the tight physical arrangement. Other target materials, like copper, are also conceivable.

Figure 1B:
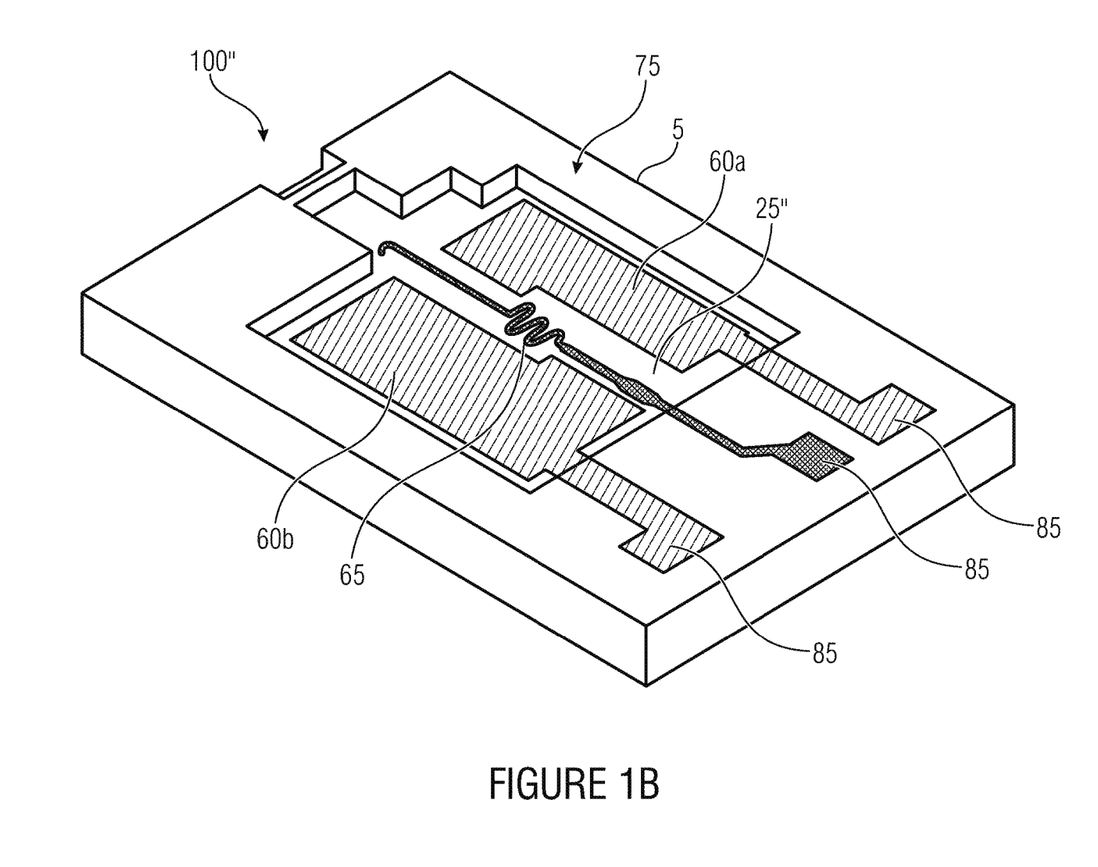
FIG. 1b is a schematic top view of a top part of the cyclic accelerator.

FIG. 1b shows the "lid" 100 of the MEMS cyclotron or cyclic accelerator of practically equal dimensions. Same basically carries the electrical components necessitated for operation. This lid may also be deep-etched, but is covered on its surface with an insulator, since it carries the acceleration "dees" (the electrodes 60a,b) and the electron emitter 65. Most suitable for the electrodes 60a,b are metal layers (like aluminum, tungsten) which correspondingly are structured lithographically. By suitable shaping, the cyclotron receives an advantageous sense of rotation. However, this is not necessary, but makes the arrangement of the target easier.

The vacuum part (cf. FIG. 1a) may advantageously also be provided with geometrically corresponding electrodes made of metal so as to suppress an axial component of electron movement. The two electrodes are suitably connected in an electrically conductive manner.

FIGS. 1a and 1b, in combination, show a cyclic accelerator 100 (cf. FIG. 2) for accelerating charge carriers. The cyclic accelerator 100 includes a charge carrier source 65, a vacuum chamber 25 and electrodes 60a,b. In addition, the cyclic accelerator includes a magnetic field generator (shown in FIG. 2) which generates a magnetic field 70 which is perpendicular to the direction of movement of the charge carriers. The charge carrier source 65 is configured to generate free charge carriers which are received by the vacuum chamber 25. The vacuum chamber is produced by means of MEMS technology and may comprise a semiconductor material at least at a main surface region 25' of the vacuum chamber 25. The electrodes 60a,b are configured to accelerate the free charge carriers in the vacuum chamber 25 by means of an alternating current field between the electrode 60a and the electrode 60b.

MEMS (microelectromechanical system) technology here means a mask-defined etching and doping method which advantageously may be used on semiconductor materials, but also in connection with other materials. A wet or dry method may, for example, be used as the etching method. Another characteristic of MEMS technology is the possibility of applying very thin layers onto the surface of the semiconductor material. Thus, it is possible, for example, to deposit thin metal layers which exemplarily function as electrodes. Additionally, depositing lithography masks which are structured by means of specific exposure is also possible. Depending on the method, either the exposed or the unexposed regions are protected against etching by the etching medium. Thus, specific regions in the semiconductor material may be removed by etching.

The electrodes 60a,b may consequently be generated by specifically doping the semiconductor material 5 or by depositing a metal layer, for example. Deposition may take place using CVD (chemical vapor deposition), PVD (physical vapor deposition) or another suitable method.

As has been described already, the vacuum chamber 25 may be generated by etching the semiconductor material 5. Alternatively, the vacuum chamber 25 may also be etched into a layer, applied onto the semiconductor material, made of a different material, for example a protection or insulation layer, such that only the surface of the semiconductor material 5, for example, is etched free. Thus, it is also possible to use the semiconductor material as an etch stop. Furthermore, a combination of the two methods mentioned is also possible by etching through the thin protection or insulation layer up to the semiconductor material 5. The vacuum chamber 25 resulting may exhibit a volume of less than 100 $mm^3$ or smaller than 50 $mm^3$, advantageously smaller than 10 $mm^3$.

Connecting the bottom part shown in FIG. 1a and the top part of the cyclic accelerator shown in FIG. 1b takes place in a vacuum-tight manner, for example by means of upside-down joining such that a vacuum may be maintained in the vacuum chamber over a long period of time. The air-tight connection may be produced by means of a gluing method, anodic bonding or silicon fusion bonding. The seal is, for example, realized at a circumferential bond area 75. As has already been described, it may be of advantage to arrange the electrodes 65a,b to be congruent at a main surface region 25' of the first subcomponent 100' and at a main surface region 25" of the second subcomponent 100" opposite the main surface region 25' of the first subcomponent 100'.

In accordance with an embodiment, a silicon column 80 may be left in the vacuum chamber 25 or in the center of the acceleration space 25, i.e. be excluded from etching the vacuum chamber 25. Same may exhibit a surface area of, for example, less than 1 $mm^2$ pointing towards the main surface regions of the subcomponents. This column 80 is able to mechanically support the evacuated cavity 25 which may comprise an area of up to 1 $cm^2$, since it is able to connect the lid 100" and the bottom part 100' in a supportive manner. This causes the small but existing bending of the two walls of the cavity 25 to be minimized further, or the bottom and top walls of the cavity may be implemented to be thinner and thus the entire MEMS structure be dimensioned to be thinner, thereby reducing the demands to the magnetic guidance field 70 further. A heatable metal filament which serves as an electron emitter 65 may then be applied (for example lithographically) at the essentially cylindrical, vertical area of this column.

Embodiments show the charge carrier source 25 comprising a heating wire which is insulated thermally from the semiconductor material 5. In order to increase the number of free charge carriers which may be emitted by the charge carrier source 25, it is of advantage to cover the charge carrier source 25 with an alkaline earth oxide. Alternatively, the charge carrier source 25 may be a carbon nanotube or a Spindt emitter, wherein the Spindt emitter is manufactured by means of MEMS technology.

In other words, the electron emitter 65 may be a Spindt emitter, i.e. a nano tip generated using etching technology, comprising an extraction electrode. Easier to realize, however, is a hot cathode; as is well-known, this may be achieved as follows: at the desired location of emission, i.e. in the center of the cyclotron 100, there is a planar meandering structure made of metal (tungsten) which serves for heating and is supplied using two or one (in this case circuit to bulk silicon/mass) conductive trace(s). The conventional methods for such heater structures may be used, i.e., for example, decreasing the vertical heat conduction from the meander downwards by means of exposing by etching. In order to increase electron emission, the meandering structure may be covered with a material of little work function, for example barium or lanthanium oxide.

The cyclic accelerator 100 or MEMS chip comprises three or four connections 85, for example, which feed the acceleration high frequency to the electrodes 60a, 60b, and the heating power to the charge carrier source 85. The terminal pad 85 shown in FIG. 1b may advantageously be through-contacted to be on the real surface, i.e. an outer surface region after connecting the two subcomponents 100, 100'.

Figure 2:
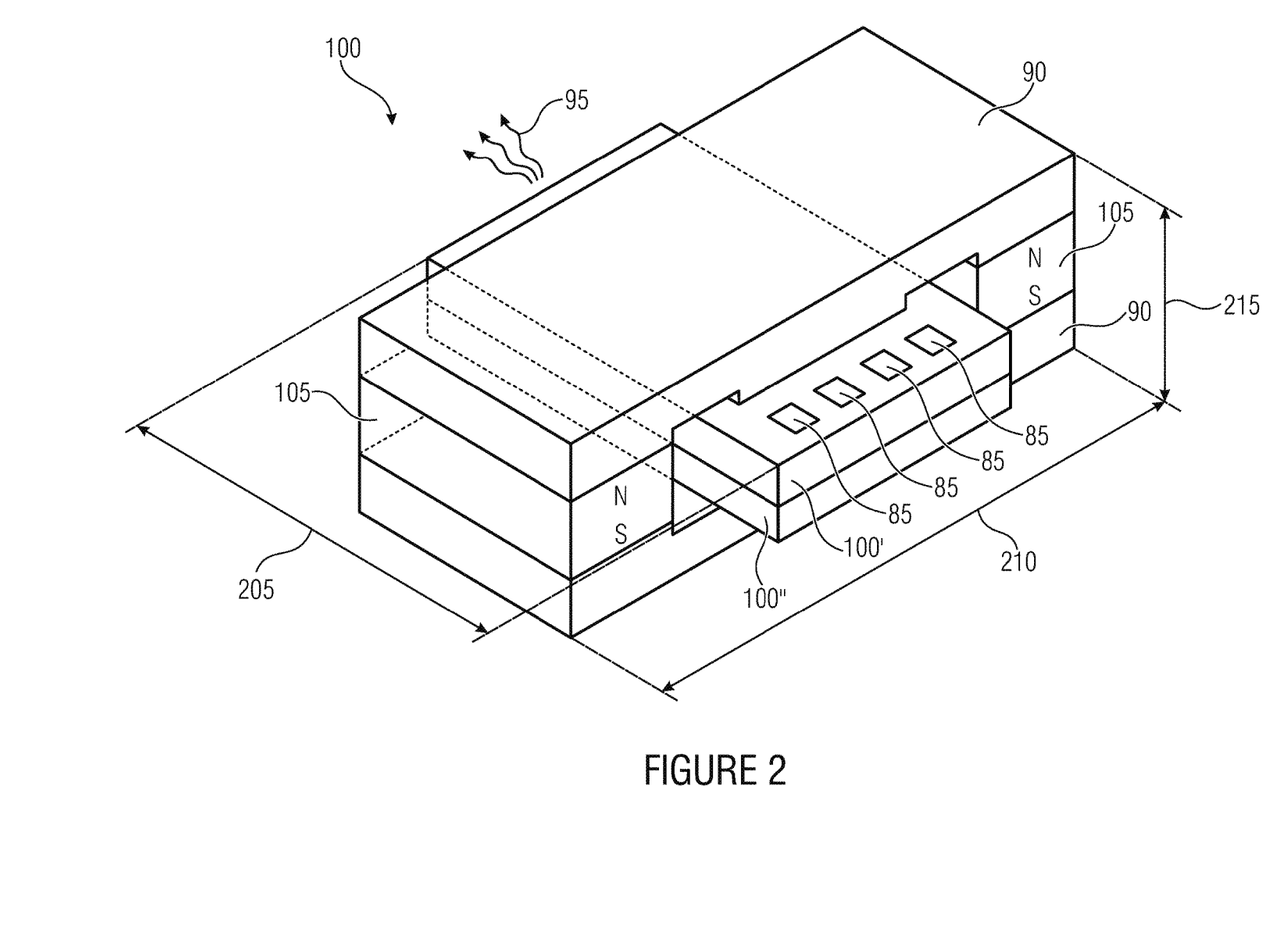
FIG. 2 shows a schematic top view of the cyclic accelerator comprising the bottom and top parts of FIGS. 1a, b which are connected, and two magnets which are connected to each other via pole shoes.

FIG. 2 shows the cyclotron 100, combined from the two parts 100', 100", between the poles of the guiding magnetic field. The magnetic field 70 may, as described, be generated by permanent magnets 105, the magnetic flow of which is suitably directed by highly permeable materials 90 through the cyclotron acceleration region 25. Thus, the geometrical implementation of the magnetic conductors 90 may, as is well known, be implemented as "pole shoes" such that the homogeneity necessitated for dedicated operation, including focusing radial field components, is achieved. Since in the present case the volume to be magnetized with typically 0.05 $cm^3$ is small, comparably small magnets and thin magnet conductors (cross section of roughly 1.2×10 $mm^2$) will do. These may also be set up from highly permeable films arranged in layers which due to their geometrical shaping form laterally structured "pole shoes".

The exit window 45 (cf. FIGS. 1a,b) of the x radiation 95 generated exemplarily includes silicon which, for reasons of simplicity, may be generated lithographically/using an etching technique during the manufacturing process and thus exhibits high precision and/or small thickness. For bremsstrahlung generated, for example, at the tungsten target (atomic number 74), a layer of roughly 10 . . . 20 μm of silicon (atomic number 14) is several hundred times more transparent than tungsten or lead.

Instead of the x-rays, the accelerated electrons may also be coupled out by a suitable window so as to impinge on any target. Of advantage here is that silicon as the structural material exhibits a comparably high transparency for electrons and that, on the other hand, dimensions of a "window thickness" of a few μm may be manufactured using the etching technology.

Coupling out electrons from their circular or spiral trajectory on which the acceleration is based takes place electrostatically, as is conventional, or by a suitable radial implementation of the magnetic guiding field.

The dimensions 205, 210, 215 of the circular accelerator 100 may, for example, be in the region of 12×20×8 mm.

Figure 3:
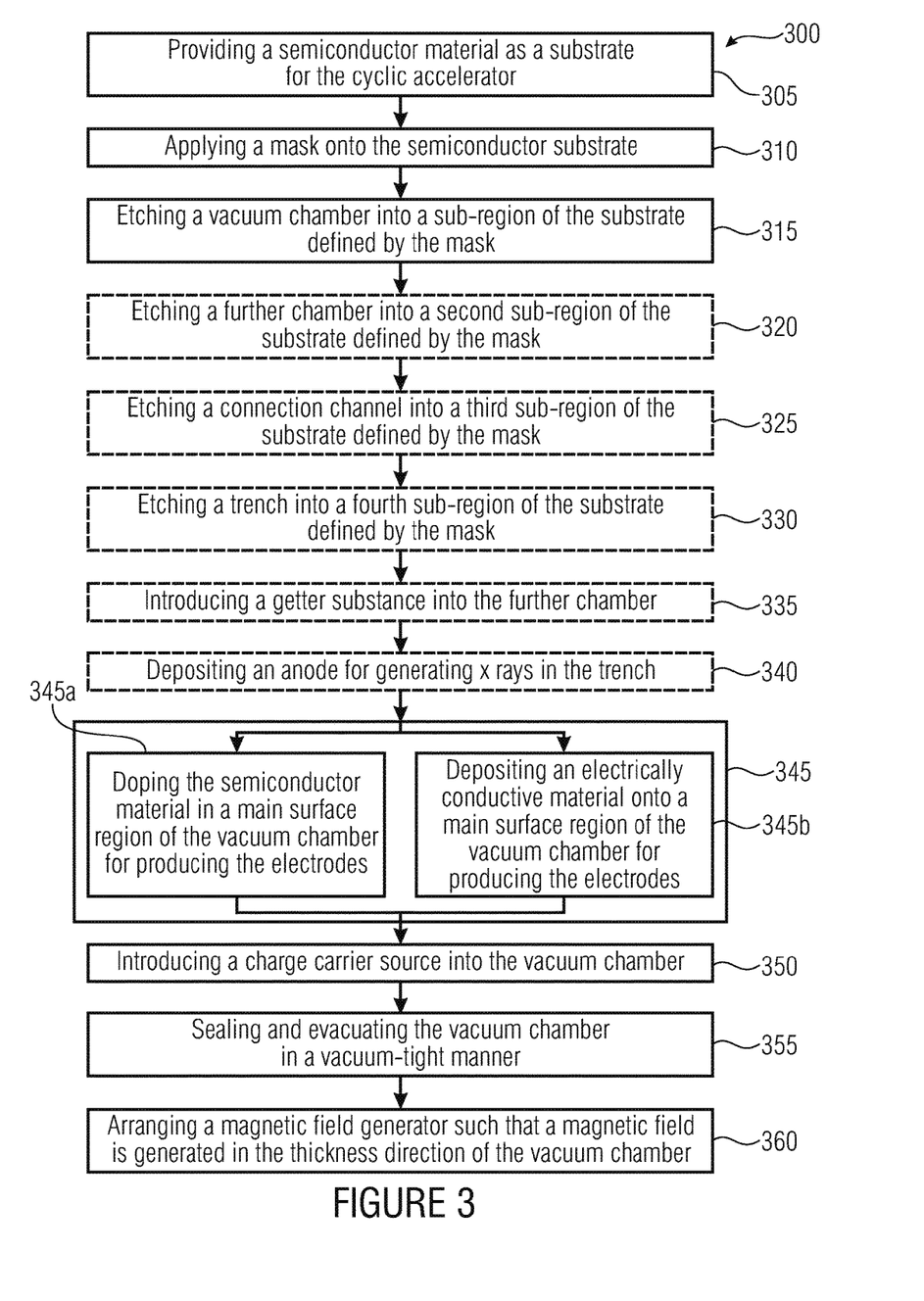
FIG. 3 shows a schematic illustration of a block diagram of the method for manufacturing the cyclic accelerator.

FIG. 3 shows a method 300 for manufacturing the cyclic accelerator 100. In step 305, providing a semiconductor material, for example a piece of silicon 5 with a size of 10×10×0.5 μm, as the substrate for the cyclic accelerator takes place. After applying a mask onto the semiconductor substrate or a layer of another material, arranged above the semiconductor material in step 310, a circular or rectangular recess, for example, is etched into a sub-region of the substrate defined by the mask in step 315, the recess representing the acceleration container 25 (vacuum chamber) (after vacuum-tight covering and evacuation in step 355). In step 345, for example, two semi-circular electrodes ("dees") are arranged or generated within the exemplarily circular acceleration chamber. These two electrodes may be manufactured in a particularly suitable manner by correspondingly doping certain silicon regions (cf. optional step 345a). Alternatively, the electrodes may also be generated by depositing an electrically conductive material on the main surface region 25" of the vacuum chamber 25 (step 345b). The high-frequency voltage (exemplarily 30 GHz, 30V) necessitated for acceleration is applied to these electrodes 60a,b later on. The comparably high voltage forms by resonance super-elevation as a multiple of the voltage of the output stage of the oscillator. After having passed several hundred times, the electrons have reached an energy of roughly 200 keV.

In step 350, the charge carrier source 65 is introduced, for example in the center of the cavity etched in step 315. The charge carrier source 25 is alternatively also referred to as electron source or emitter. In the easiest case, this emitter is a metal structure (meander) insulated thermally from the substrate, which is heated to the temperature necessitated for electron emission. Usually, like in vacuum tube technology, emission may, for example, be increased by covering with alkaline earth oxides (BaO). Alternatively, emitters may be realized as Spindt emitters (particularly fine etched silicon tips) or CNT (carbon nanotube) emitters. A combination of several emitter principles is also conceivable to be of advantage.

In two steps 320 and 325, apart from the acceleration container 25 on silicon, one or several further chambers 35 may be etched into a second sub-region of the substrate defined by the mask, and a connection channel 30 be etched into a third sub-region of the substrate defined by the mask. The vacuum chamber 25 is connected by means of the channel 30 to the one or further side chambers 35 serving for evacuating and maintaining a vacuum.

After defining the structure, in step 355 mentioned already, the two subcomponents 100' and 100" are sealed in an air-tight manner or fitted to each other in a vacuum-tight manner, for example by means of a bond process. Sealing may take place already in the vacuum or, alternatively, the vacuum chamber may be sealed subsequently. In order to bind residual gases, advantageously a metal coat (for example titanium, magnesium), a so-called getter substance, arranged in the side chambers 35 is introduced in an optional step 335. The metal, fresh on the surface, soon binds first reactive gases ($O_2$, $N_2$, $H_2O$) on the surface, while forming MgO or $TiO_2$, for example, and evacuates the chamber. A faster and more complete evacuation of the chamber from residual gases takes place by heating the getter substance (for example by means of a laser), thereby improving the reaction of the fresh surface of the getter substance with residual gases. In addition, an excess of reactive metal, in the sense of a getter, maintains the vacuum over very long periods of time.

If the acceleration container 100' is manufactured only from one sub-region with active components, i.e. the electrical structures and the structures of maintaining the vacuum are realized in the subcomponent 100', sealing the acceleration container open towards the top takes place by means of conventional methods, like silicon fusion bonding or anodic bonding, using another piece of silicon. Alternatively, different coat layers, for example quartz or metal films, may also be used. With dimensions of typically 1 cm², the entire structure is to exhibit a thickness of typically less than 0.7 mm. With pole shoe distances of less than 1 µm, consequently the volume through which the magnetic field is to pass is only a few cubic millimeters and consequently easy to realize.

This miniaturized structure is, in step 360, placed in a magnetic field generated basically by means of one or several permanent magnets. A suitable wiring of the electron emitter results in the emission of electrons, the high-frequency field accelerates these electrons, wherein a typical final energy of about 30 . . . 200 keV is to be strived for. With higher energy, relativistic effects are to be considered with this simple configuration.

In an optional step 330, at first a trench may be etched in a fourth sub-region of the substrate or the protection or insulation layer, into which an anode for generating x-rays is deposited in step 340. The accelerated electrons are finally directed to the anode or, in case there is no anode, extracted by a window. Such a window may consist of thin graphite, diamond or, suitably, thin silicon. The accelerated electrons may also be directed to a target outside the actual cyclotron. This offers the advantage of being able to use any different targets (also referred to as anti-cathode or anode) and generate advantageously characteristic x-rays, in correspondence with the material used.

The accelerated electrons may also be directed to a target within the cyclotron, i.e. on the same substrate. Targets of high atomic number may be suitable for generating x-rays, when predominantly spectral continuous bremsstrahlung is to be generated. A suitable material here is tungsten. Tungsten is of advantage since it is available technologically in silicon MEMS technology. A photolithographically structured, deep-etched trench may, for example, be generated in step 345 in silicon and be filled with chemically deposited tungsten in step 350. This serves as an "anode". Coupling the electrons out from the circular trajectory takes place, as is well-known, by applying a permanent or pulsed radial E field to the electrode. This electrode may also be realized by a highly doped region.

Generating the magnetic field by means of a permanent magnet minimizes energy consumption. However, the excitation frequency and the magnetic field are connected. Advantageously, the electrical excitation takes place at its resonant frequency which is determined by the geometrical circumstances and practically is difficult to detune. It is practical to adapt the magnetic field strength. This may take place either dynamically by an auxiliary coil through which a current flows, i.e. electrically, the field of which is added to the permanent field. However, this coil necessitates a current. It is more advantageous to set the "magnetic gap" by a small geometrical change such that the parameters optimal for acceleration will result. This may, for example, take place by a piezo film between the magnet and the acceleration container, varying the pole shoe distance in the range of µm. The piezo film adjusts the air gaps so as to adapt, if applicable, the magnetic field to the acceleration frequency which is fixed basically for resonance reasons.

The MEMS cyclotron outlined here provides electron currents in the range of typically 1 µA. The overall power and, thus, thermal stress here is several 100 mW. Compared to conventional x-ray sources, this is small, but easily sufficient for many purposes in analytics, in particular since extremely sensitive detectors have been available. Of advantage are the very small structural size, comparably cheap manufacturing and lack of high voltages. Thus, hand-held apparatuses may also be realized, for example for material analysis by means of x-rays fluorescence.

Figure 4:
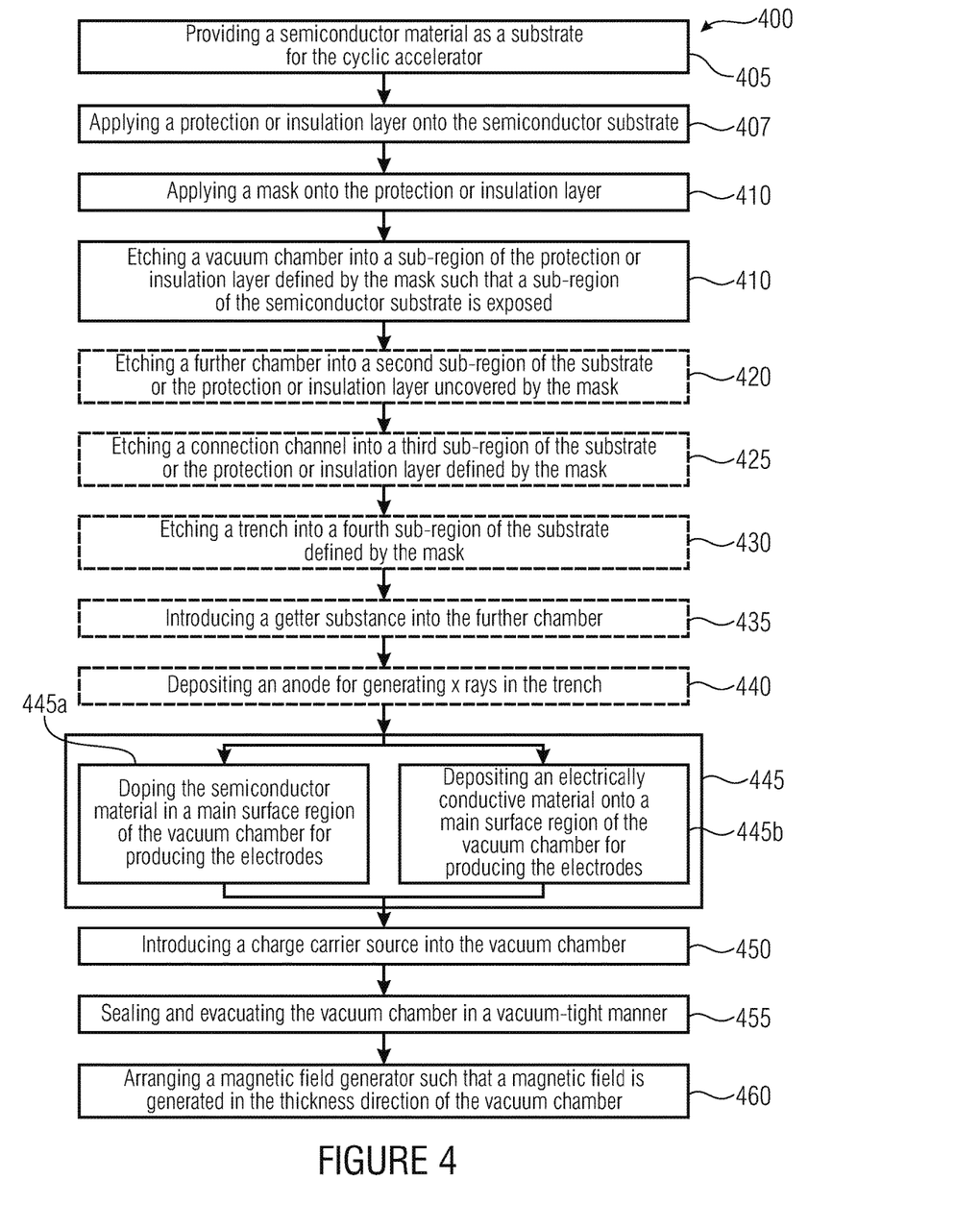
FIG. 4 shows a schematic illustration of a block diagram of an alternative method for manufacturing the cyclic accelerator.

FIG. 4 shows a method 400 for manufacturing a semiconductor material which differs from the method 300 shown in FIG. 3 by step 407. Steps 305, 405, 310 and 410 etc., are additionally equivalent. In step 407, the protection or insulation layer is applied onto the semiconductor substrate 5. In addition, the subsequent steps are performed in the layer of the further material arranged above the semiconductor material, for example the protection or insulation layer, such that the etching processes stop at the surface of the semiconductor substrate or penetrate into the surface of the semiconductor substrate. Additionally, it is to be mentioned that, in methods 300 and 400, the etching processes in steps 315, 415, 320, 420, 325, 425, 330 and 430 may take place in one step, i.e. using the mask applied in step 310 or 410. The method steps may also be exchanged among one another as desired in order to optimize the manufacturing process.

Relating to all the embodiments mentioned, it is to be pointed out that the numbers mentioned are exemplary and, in particular, not restrictive.

Although some aspects have been described in connection with a device, it is to be understood that these aspects also represent a description of the corresponding method, such that a block or element of a device is to be understood also to be a corresponding method step or feature of a method step. In analogy, aspects having been described in connection with or as a method step also represent a description of a corresponding block or detail or feature of a corresponding device.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A cyclic accelerator for accelerating electrons, comprising:
   an electron source configured to generate free electrons;
   a vacuum chamber configured to receive the free electrons, wherein the vacuum chamber is produced by means of MEMS technology;
   electrodes configured to accelerate the free electrons in the vacuum chamber by means of an alternating current field;
   a magnetic field generator configured to generate a magnetic field perpendicularly to the direction of movement of the electrons;
   wherein an anode which is configured to emit x-rays to the surroundings of the cyclic accelerator by an electron impinging is arranged adjacent to the vacuum chamber,
   wherein the cyclic accelerator comprises a first semiconductor subcomponent and a second semiconductor subcomponent which are connected to each other in a vacuum-tight manner to form the vacuum chamber therebetween.

2. The cyclic accelerator in accordance with claim 1, wherein the electrodes are formed from highly doped regions of a semiconductor material.

3. The cyclic accelerator in accordance with claim 1, wherein the vacuum chamber is produced by etching a semiconductor material or by etching a layer of another material applied onto the semiconductor material.

4. The cyclic accelerator in accordance with claim 1, wherein the vacuum chamber comprises a volume of less than 100 mm$^3$ or less than 50 mm$^3$ or less than 10 mm$^3$.

5. The cyclic accelerator in accordance with claim 1, wherein the air-tight connection is produced by means of a gluing method, anodic bonding or silicon fusion bonding.

6. The cyclic accelerator in accordance with claim 1, wherein the electrodes are arranged to be congruent at a main surface region of the first semiconductor subcomponent and at a main surface region of the second semiconductor subcomponent opposite the main surface region of the first semiconductor subcomponent.

7. The cyclic accelerator in accordance with claim 1, wherein a column which connects the two main surface regions is arranged between a main surface region of the first semiconductor subcomponent and a main surface region of the second semiconductor subcomponent opposite the main surface region of the first semiconductor subcomponent, wherein the column is configured to mechanically support both main surface regions.

8. The cyclic accelerator in accordance with claim 1, wherein the electron source is a heating wire which is insulated thermally from a semiconductor material.

9. The cyclic accelerator in accordance with claim 1, wherein the electron source is covered with an alkaline earth oxide.

10. The cyclic accelerator in accordance with claim 1, wherein the electron source is a carbon nano tube or a Spindt emitter, wherein the Spindt emitter is produced by means of MEMS technology.

11. The cyclic accelerator in accordance with claim 1, wherein the cyclic accelerator comprises another chamber, adjacent to the vacuum chamber and connected to the vacuum chamber via a connection channel, wherein a getter substance configured to react with the gaseous molecules present in the vacuum chamber and thus produce a vacuum in the vacuum chamber is arranged in the further chamber.

12. The cyclic accelerator in accordance with claim 11, wherein the getter substance is configured to locally evaporate by heating using infrared laser radiation penetrating a semiconductor material in order to act as a getter of increased surface.

13. The cyclic accelerator in accordance with claim 11, wherein the getter substance comprises titanium and/or magnesium.

14. The cyclic accelerator in accordance with claim 1, wherein the magnetic field generator comprises a permanent magnet.

15. The cyclic accelerator in accordance with claim 1,
wherein the magnetic field generator comprises at least two pole shoes;
wherein the vacuum chamber is arranged between at least two pole shoes of the magnetic field generator.

16. The cyclic accelerator in accordance with claim 15, wherein a piezo film configured to adjust a distance between the at least two pole shoes such that a desired resonant frequency of the accelerated electrons is achieved is arranged between the at least two pole shoes.

17. The cyclic accelerator in accordance with claim 1, wherein the magnetic field generator comprises a plurality of highly permeable films arranged in layers, configured to form laterally structured pole shoes.

18. The cyclic accelerator in accordance with claim 1, wherein the cyclic accelerator comprises an auxiliary coil through which a current flows, configured to adjust the magnetic field of the magnetic field generator such that a desired resonant frequency of the accelerated electrons is achieved.

19. The cyclic accelerator in accordance with claim 1, wherein the cyclic accelerator comprises a fixed-frequency oscillator or a Gunn diode configured to apply an alternating voltage to the electrodes, wherein the alternating voltage comprises a frequency which is adapted to the geometry of the vacuum chamber.

20. A method for manufacturing a cyclic accelerator, comprising:
providing a substrate which comprises a semiconductor material, for the cyclic accelerator;
applying a mask onto the substrate;
etching a vacuum chamber into a sub-region of the semiconductor material defined by the mask or a layer of another material arranged above the semiconductor material;
producing electrodes at a main surface region of the vacuum chamber;
introducing an electron source into the vacuum chamber;
sealing and evacuating the vacuum chamber in a vacuum-tight manner;
arranging a magnetic field generator such that a magnetic field is generated in the thickness direction of the vacuum chamber;
arranging an anode adjacent to the vacuum chamber, wherein the anode is configured to emit x-rays to the surroundings of the cyclic accelerator by an electron impinging.

21. The method in accordance with claim 20, comprising:
etching a further chamber in a second sub-region of the substrate defined by the mask or the layer of the further material arranged above the semiconductor material;
etching a connection channel in a third sub-region of the substrate defined by the mask or the layer of the further material arranged above the semiconductor material;
introducing a getter substance in the further chamber.

22. The method in accordance with claim 20, comprising:
etching a trench in a fourth sub-region of the substrate uncovered by the mask or the layer of the further material arranged above the semiconductor material;
depositing an anode for generating x-rays in the trench.

23. The method in accordance with claim 20, comprising:
doping the semiconductor material in a main surface region of the vacuum chamber for generating the electrodes; or
depositing an electrically conductive material on a main surface region of the vacuum chamber for generating the electrodes.

* * * * *